US012625175B2

(12) United States Patent
Zhadobov et al.

(10) Patent No.: US 12,625,175 B2
(45) Date of Patent: May 12, 2026

(54) DEVICE FOR ELECTROMAGNETIC EXPOSURE ASSESSMENT COMPRISING A FIELD ENHANCING ELEMENT

(71) Applicants: UNIVERSITE DE RENNES, Rennes (FR); CENTRE NATIONAL DE LA RECHERCHE SCIENTIFIQUE, Paris (FR); INSTITUT NATIONAL DES SCIENCES APPLIQUEES DE RENNES, Rennes (FR); NANTES UNIVERSITÉ, Nantes (FR); CENTRALESUPELEC, Gif-sur-Yvette (FR)

(72) Inventors: Maxim Zhadobov, Rennes (FR); Artem Boryskin, Thorigne Fouillard (FR); Ronan Sauleau, Acigne (FR)

(73) Assignees: UNIVERSITÉ DE RENNES, Rennes (FR); CENTRE NATIONAL DE LA RECHERCHE SCIENTIFIQUE, Paris (FR); INSTITUT NATIONAL DES SCIENCES APPLIQUÉES DE RENNES, Nantes (FR); CENTRALESUPÉLEC, Gif-sur-Yvette (FR)

( * ) Notice: Subject to any disclaimer, the term of this patent is extended or adjusted under 35 U.S.C. 154(b) by 148 days.

(21) Appl. No.: 18/702,847

(22) PCT Filed: Oct. 20, 2022

(86) PCT No.: PCT/EP2022/079267
§ 371 (c)(1),
(2) Date: Apr. 19, 2024

(87) PCT Pub. No.: WO2023/067091
PCT Pub. Date: Apr. 27, 2023

(65) Prior Publication Data
US 2024/0418759 A1     Dec. 19, 2024

(30) Foreign Application Priority Data
Oct. 22, 2021     (EP) ..................................... 21306475

(51) Int. Cl.
*G01R 19/00*          (2006.01)
*G01R 29/08*          (2006.01)
(52) U.S. Cl.
CPC ..... *G01R 29/0878* (2013.01); *G01R 29/0857* (2013.01)
(58) Field of Classification Search
CPC ........................ G01R 29/0857; G01R 29/0878
See application file for complete search history.

(56) References Cited

U.S. PATENT DOCUMENTS

2004/0232776 A1* 11/2004 Ozaki ................ G01R 29/0857
307/149
2004/0251899 A1* 12/2004 Swartz ..................... G01T 1/04
324/316
(Continued)

FOREIGN PATENT DOCUMENTS

WO      2016069761      5/2016
WO      2017173350      10/2017

OTHER PUBLICATIONS

Nacer Chahat et al: "Broadband Tissue-Equivalent Phantom for BAN Applications at Millimeter Waves", IEEE Transactions on Microwave Theory and Techniques, IEEE, USA, vol. 60, No. 7, Jul. 1, 2012, pp. 2259-2266, XP011448665, ISSN: 0018-9480, DOI: 10.1109/TMTT.2012.2195196, p. 2259-p. 2263, figures 1-8.
(Continued)

*Primary Examiner* — Thang X Le
(74) *Attorney, Agent, or Firm* — Perman & Green, LLP

(57)                ABSTRACT
A device for measuring a physical quantity related to an electromagnetic field emitted by an electromagnetic source. The device is configured to simulate the electromagnetic
(Continued)

characteristics of a reference object made of a lossy medium, e.g. a biological tissue. The device includes: a dielectric layer including an upper surface faced to the electromagnetic source and a bottom surface, the dielectric layer being at least partly transparent to the electromagnetic field emitted by the electromagnetic source; an electromagnetic field enhancing element arranged relative to the dielectric layer and configured in a manner to enhance the intensity of the electromagnetic field transmitted through the dielectric layer in a pre-determined zone; and a sensor arranged beneath the electromagnetic field enhancing element and configured to measure the physical quantity related to the electromagnetic field transmitted through the dielectric layer and the electromagnetic field enhancing element.

16 Claims, 8 Drawing Sheets

(56)                References Cited

U.S. PATENT DOCUMENTS

| | | | |
|---|---|---|---|
| 2006/0124833 A1* | 6/2006 | Toda | H10F 77/337 |
| | | | 250/214 R |
| 2012/0161789 A1* | 6/2012 | Girlando | G01N 33/38 |
| | | | 29/592.1 |
| 2013/0144149 A1* | 6/2013 | Luo | A61B 5/685 |
| | | | 600/407 |
| 2017/0090221 A1* | 3/2017 | Atwater | G02B 1/002 |

OTHER PUBLICATIONS

Gabriel C: "Tissue equivalent material for hand phantoms", Physics in Medicine and Biology, Institute of Physics Publishing, Bristol GB, vol. 52, No. 14, Jul. 21, 2007, pp. 4205-4210, XP020112970, ISSN: 0031-9155, DOI: 10.1088/0031-9155/52/14/012, p. 4205-p. 4209, figures 1-3.

Guraliuc Anda R et al: "Solid Phantom for Body-Centric Propagation Measurements at 60 GHz", IEEE Transactions on Microwave Theory and Techniques, IEEE, USA, vol. 62, No. 6, Jun. 1, 2014, pp. 1373-1380, XP011549851, ISSN: 0018-9480, DOI: 10.1109/TMTT.2014.2320691, retrieved on Jun. 2, 2014, p. 1373-p. 1378, figures 1-7.

Pellegrini A et al: "Antennas and Propagation for Body-Centric Wireless Communications at Millimeter-Wave Frequencies: A Review [Wireless Corner]", IEEE Antennas and Propagation Magazine, IEEE Service Center, Piscataway, NJ, US, vol. 55, No. 4, Aug. 1, 2013, pp. 262-287, XP011531255, ISSN: 1045-9243, DOI: 10.1109/MAP.2013.6645205, retrieved on Oct. 22, 2013, p. 262-p. 270, figures 1-10.

Ziane Massinissa et al: "High-Resolution Technique for Near-Field Power Density Measurement Accounting for Antenna/Body Coupling at Millimeter Waves", IEEE Antennas and Wireless Propagation Letters, IEEE, Piscataway, NJ, US, vol. 20, No. 11, Jun. 7, 2021, pp. 2151-2155, XP011888269, ISSN: 1536-1225, DOI: 10.1109/LAWP.2021.3087019, retrieved on Nov. 15, 2021, p. 2151-p. 2154, figures 1-4.

International Search Report for application No. PCT/EP2022/079267 dated Oct. 2, 2023.

* cited by examiner

DEVICE FOR ELECTROMAGNETIC EXPOSURE ASSESSMENT COMPRISING A FIELD ENHANCING ELEMENT

CROSS REFERENCE TO RELATED APPLICATIONS

This application is a National Stage of International Application No. PCT/EP2022/079267, having an International Filing Date of 20 Oct. 2022, which designated the United States of America, and which International Application was published under PCT Article 21(2) as WO Publication No. 2023/067091 A1, which claims priority from and the benefit of European Patent Application No. 21306475.1 filed on 22 Oct. 2021, the disclosures of which are incorporated herein by reference in their entireties.

BACKGROUND

Field The disclosure relates to a device for electromagnetic dosimetry, and more particularly, the present disclosure relates to a device for simulating some of the electromagnetic characteristics of a reference object made of lossy medium, e.g a biological tissue, particularly a human tissue, and measuring the electromagnetic dosimetry quantities induced in the lossy medium by electromagnetic fields emitted by an electromagnetic source.

Brief Description of Related Developments

With the development of the wireless technology, in particularly in case of cellular phones which are used in contact with the human body, measuring precisely the exposure level of the radiation of the electromagnetic (EM) wave in a human body becomes a critical factor.

Various categories of devices reproducing electromagnetic properties of biological tissues, commonly named as "phantoms" for evaluating the exposure of the human body to electromagnetic waves exist: liquid phantoms, semi-solid phantoms, solid phantoms as well as hybrid phantoms. The liquid phantom comprises a plastic part or a solid shell filled with a gel or a liquid having similar EM properties to those of the human biological tissues at the measurement frequency typically provided thanks to a high content of water, like in biological tissues, these devices are generally used in the frequency ranges from 30 MHz to 6 GHz. These devices have several problems: the liquid needs to be changed frequently due to the evaporation and/or the degradation of the dielectric properties of the liquid over time. These devices require special test equipment to support their weight. The use of the such devices at frequencies above 6 GHz is not possible due to the strong absorption of the EM field by water molecules, leading to a very shallow EM field penetration depth and thus insufficient signal-to-noise ratio (SNR) for embedded sensors. Composition of the semi-solid phantoms is similar to the liquid phantom and a jellifying agent is usually used instead of a liquid to retain the shape of the phantom without using a solid shell. Their main drawback is a limited lifetime (typically limited to days or weeks). The solid phantom is a solid piece made of solid dielectric material, like plastic, polymer, ceramic or synthetic rubbers doped with conductive particles such as graphite, carbon, or metal. The main advantage thereof is the reliability and the constancy of the dielectric properties thereof over time. However, these devices are quite complex and costly to manufacture. Furthermore, they also suffer from high EM losses that do not allow the measurement above 6 GHz. For instance, at 60 GHz, the penetration depth of electromagnetic radiation in the human tissues is of the order of 0.5 mm and the absorption of radiation is essentially limited to the superficial layers of the body. This leads to a prohibitively low signal-to-noise ratio (SNR) for any sensor embedded in a phantom reproducing the EM properties of said biological tissue.

In addition, recent wireless communication devices have more than one antenna and are able to operate in multiple frequency bands and modes. The use of traditional dosimetry devices has several limitations and drawbacks, among which is the complex and time-consuming compliance testing procedure.

In this perspective, due to the specificity of the frequency-dependent interaction between the human body and the wireless devices, leading to lower reflection and simultaneously to stronger EM losses, and the compliance testing of wireless devices of 5G and beyond generations operating at frequencies above 6 GHz, the new dosimetry standards and guidelines are formulated in terms of the transmitted and/or absorbed electromagnetic power density per a given surface area, which is proportional to the EM field intensity, instead of the measurement of the volumetric dosimetric quantities, such as specific absorption rate (SAR).

The document WO2017/0173350 and with reference to FIG. 1, proposes a device having characteristic of human tissues while being able to measure electromagnetic waves at frequencies greater than 6 GHz. It comprises one layer of a dielectric material (S), a semitransparent metal shield (MSH) with through holes (OSH) and an array of sensors (SENS) placed below the through holes. The sensors are configured to measure the electromagnetic field emitted by an electromagnetic source (EMS).

Although the device proposed in this document offers the reliability and the constancy of the dielectric properties and potentially allows a measurement of electromagnetic waves at frequencies above 6 GHz, the proposed solution does not teach how to reduce or limit the significant losses of the electromagnetic field intensity during its propagation through the compound dielectric material comprising 40% of carbon microparticles that results in strong absorption of the electromagnetic field at high frequencies, in particular above 6 GHz.

Moreover, similarly to other prior art solutions, the measurement procedure used in WO2017/0173350 relies on sampling of the transmitted field in a plurality of space points defined by positions of the sensors in the array of sensors (SENS). This may cause inaccuracies due to the fixed mesh of the sampling points dictated by the array of sensor topology and due to the additional postprocessing steps of digital integration of the measured quantities in order to compute a dosimetric quantity defined for a given surface area or volume.

The high EM losses may sacrifice the accuracy of the measurements and reduce the signal-to-noise ratio (SNR). In order to increase the signal-noise-ratio, that is a critical parameter for low-power measurements, it is necessary to increase either the sensitivity of sensors or the level of the transmitted electromagnetic signal. The latter is usually preferred as it allows to deal with a higher noise level. These limitations can be critical in terms of accuracy and cost of the dosimetry device for compliance of $5^{th}$ and beyond generations of wireless devices.

Therefore, there is a need for an improved device for electromagnetic dosimetry that can be used to carry out measurements more precisely than previous solutions especially at frequencies above 6 GHz.

It is an object of the present disclosure to provide an electromagnetic dosimetry device which can simultaneously reproduce the EM scattering characteristics of a reference object, e.g. a biological tissue, represented by the phantom structure, and enhance the intensity of the electromagnetic field transmitted through the phantom structure. Thus, despite of the unavoidable loss of the electromagnetic fields in the phantom structure, it is still possible to keep an appropriate SNR and to maintain the accuracy of the measurements even at high frequencies.

Another aim of the present disclosure is to propose a device which allows to convert the unavoidable electromagnetic loss in the phantom material into a measurable physical quantity, i.e. local heat, correlated with the sought dosimetry quantity, thus providing an alternative approach for building the EM dosimetry system Another aim of the present disclosure is to provide a device which is easier and less expensive to manufacture.

SUMMARY

This disclosure improves the situation.

It is proposed a device for measuring a physical quantity related to an electromagnetic (EM) field emitted by an electromagnetic source, the device configured to simulate the EM characteristics of a reference object made of a lossy medium, e.g. a biological tissue, particularly a human tissue, comprising:

at least one dielectric layer comprising an upper surface face to the electromagnetic source and a bottom surface, said dielectric layer being at least partly transparent to the EM field emitted by the electromagnetic source;

at least one electromagnetic field enhancing element arranged relative to the at least one dielectric layer and configured in a manner to enhance the intensity of the electromagnetic field transmitted through the at least one dielectric layer in a pre-determined zone;

at least one sensor arranged beneath the at least one electromagnetic field enhancing element and configured to measure said physical quantity related to the electromagnetic field transmitted through the at least one dielectric layer and the at least one electromagnetic field enhancing element.

In an aspect, the at least one electromagnetic field enhancing element extends from the bottom surface of the at least one dielectric layer towards the at least one sensor.

In another aspect, the at least one electromagnetic field enhancing element is at least partly embedded in the at least one dielectric layer, said at least one dielectric layer having a complex permittivity with absolute value smaller than that of the material of the EM field enhancing element.

In one further aspect, the device comprises at least two dielectric layers, the dielectric layer having a bottom surface face to the sensor comprising a cavity filled with a host medium, the at least one electromagnetic field enhancing element being placed in the cavity, the host medium having a complex permittivity with absolute value smaller than that of the material of the EM field enhancing element.

In an aspect, the device further comprises at least one electrically conductive layer positioned on the bottom surface of the at least one dielectric layer.

In one variant, the at least one electrically conductive layer comprises one open cavity, the electromagnetic field enhancing element being placed in the open cavity.

In another variant, the at least one conductive layer comprises at least one through hole and the size of the at least one through hole being smaller than that of the EM field enhancing element, the EM field enhancing element being positioned on the bottom surface of the conductive layer in a manner to cover at least one through hole.

In another further variant, the at least one conductive layer comprising at least one through hole and the size of the at least one through hole being smaller than that of the EM field enhancing element, the EM field enhancing element placed in the cavity is aligned with the at least one through hole.

In an aspect, the dimension of the electromagnetic field enhancing element is configured to generate a hot zone, corresponding to an enhancement of the electromagnetic field intensity, in a determined position ($Z_m$) close to one end of the electromagnetic field enhancing element.

In a preferred aspect, the minimum size of the electromagnetic field enhancing element in a cut plane (X-Y) is equal or greater than a half of the wavelength in the medium of the EM field enhancing element and the maximum size of the electromagnetic field enhancing element in a cut plane (X-Y) is equal or smaller than ten times the wavelength in the medium of the EM field enhancing element.

In an aspect, the at least one sensor is a thermal sensor positioned in direct contact with the at least one electromagnetic field enhancing element or embedded in the at least one electromagnetic field enhancing element.

In another aspect, the at least one sensor is an electromagnetic sensor operating at the frequency of the source.

In another further aspect, the at least one sensor is an electromagnetic sensor operating at a frequency different from that of the electromagnetic source.

In yet another aspect, the device further comprises a frequency converter in contact with or embedded in one end of the at least one electromagnetic field enhancing element.

In a preferred aspect, the device comprises a plurality of electromagnetic field enhancing element, each element being configured to cover a complementary portion of the electromagnetic field transmitted through one zone of the surface area of the reference object illuminated by an electromagnetic field emitted by the electromagnetic source, said complementary portion of the electromagnetic field being defined by the illumination conditions.

In another aspect, it is proposed a system for measuring a dosimetry quantity related to an electromagnetic (EM) field emitted by an electromagnetic source comprising a device of any of the preceding claims, a signal analyzing unit configured to analyze the signal transmitted from the at least one sensor, a processing unit configured to calculate the electromagnetic dosimetry quantities and a memory unit.

BRIEF DESCRIPTION OF DRAWINGS

Other features, details and advantages will be shown in the following detailed description and on the figures, on which.

DETAILED DESCRIPTION

Figure 1:
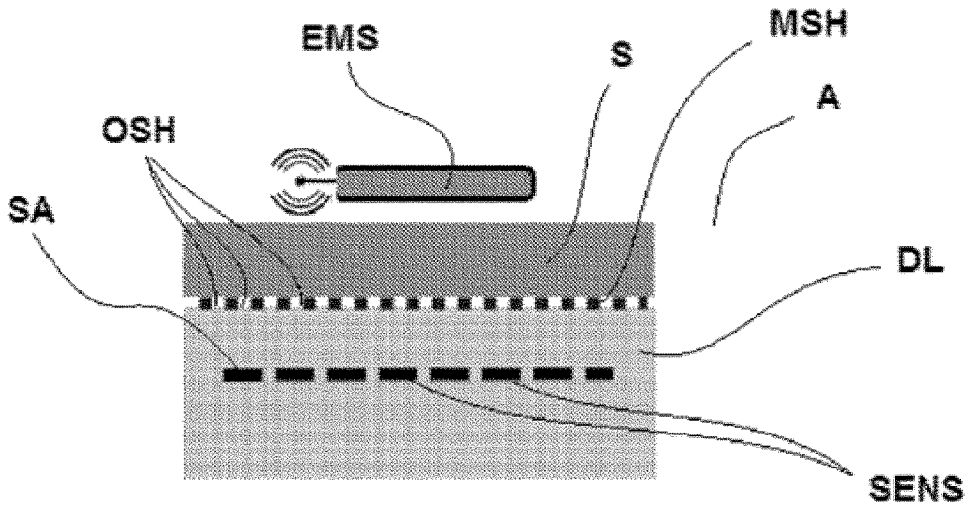
FIG. 1 is a schematic illustration of a cross-sectional view of a device for electromagnetic dosimetry of the prior art.

The terms "top," "bottom," "over," "under," "between," "on", and other similar terms as used herein refer to a relative position. The relative position of the terms does not define or limit the layers to a vector space orientation.

To facilitate understanding, identical reference numerals have been used, where possible, to designate identical elements that are common to the figures. It is contemplated that elements disclosed in one aspect may be beneficially utilized on other aspects without specific recitation.

In the present disclosure, the term "layer" refers to a structure having a constant thickness or a variable thickness. The layer may be planar or curved. In particular, the layer may be shaped to reproduce a 3D form of a part of a human body, e.g. head or hand. The layer may be shaped to form a closed loop such a side wall of a cylindrical object.

In the present disclosure, the term "dosimetric quantity" refers to any metric used to quantify the electromagnetic exposure levels, including power density, energy density, specific absorption rate, specific energy absorption, electric field strength, magnetic field strength, electric voltage or current defined with respect to an averaging surface area or volume.

In the present disclosure, the term "electrically conductive layer" refers to a layer made of electrically conductive material having electrical conductivity $\sigma \geq 10^3$ S/m.

In the present disclosure, the term "dielectric layer" refers to a layer made of thermally conductive and electrically insulating material having electrical conductivity $\sigma$ strictly smaller than $10^3$ S/m.

Figure 2:
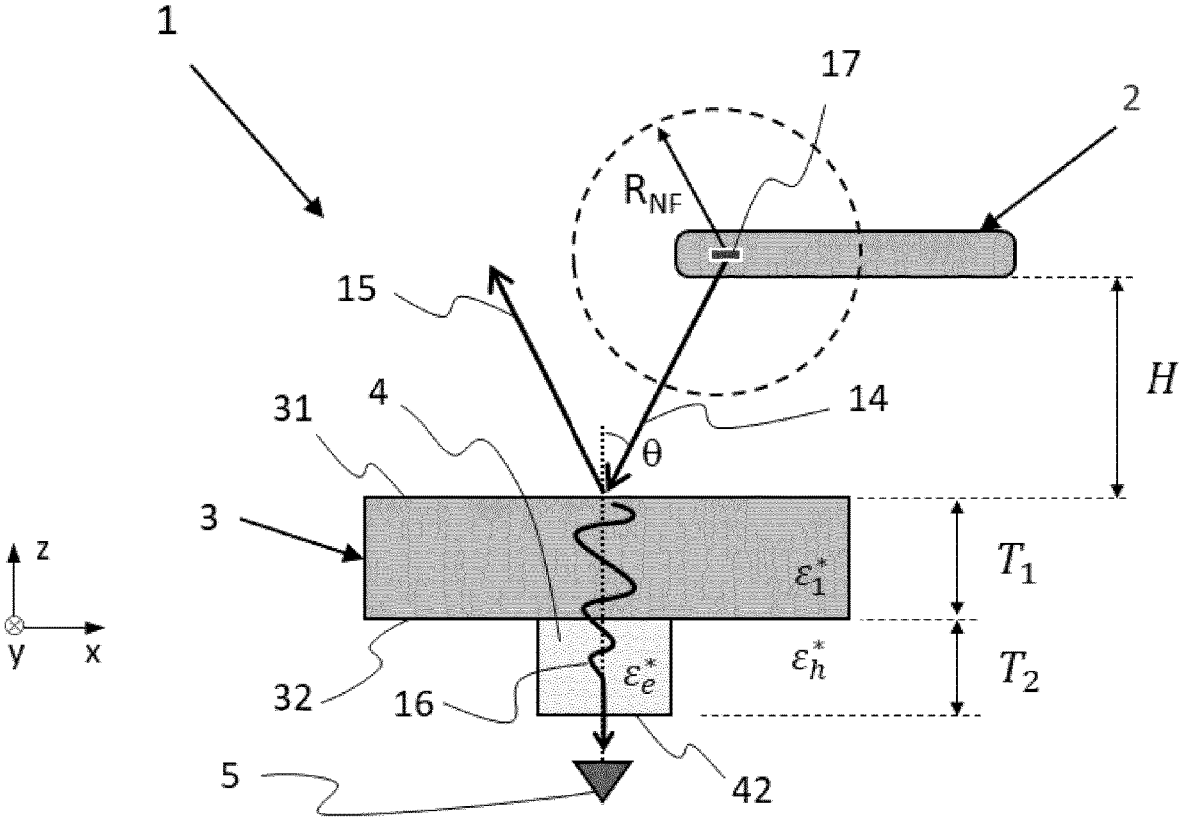
FIG. 2 is a schematic illustration of a cross-sectional view of one aspect of a device for electromagnetic dosimetry.

With reference to FIG. 2, a device 1 for dosimetry electromagnetic according to an aspect of the present disclosure will now be described. The device 1 is placed in an orthogonal spatial coordinate system (XYZ).

The device is advantageously configured to reproduce the electromagnetic response of a reference object; in particular reflection characteristics at the air/skin interface and to measure a physical quantity related to the electromagnetic field incident on the device. The measured physical quantity may be proportional to the amplitude of the EM field, intensity and/or power density of the EM field incident on or transmitted through the air/dielectric interface.

In FIG. 2, the device comprises one dielectric layer 3 extending sensibly along a plane (XY). The dielectric layer defines two main surfaces, a top surface 31 and a bottom surface 32 which extends along the plane (XY). The device may comprise more than one dielectric layer.

The dielectric layer may be made of any suitable material to simulate the EM reflection characteristics of a reference object, e.g. biological tissues, and, in particular, a human skin tissue. As non-limiting examples, the dielectric layer may be made of any solid dielectric material characterized by a relevant value of the complex dielectric permittivity, such as plastic, polymer, ceramics, glass. The one skilled in the art will easily adapt the different values of the complex permittivity to the aspects described in relation with the present disclosure.

In one example, the dielectric layer may be made of a dielectric material which is mixed with another dielectric layer or electrically conductive material. The conductive material is preferably chosen as having high electrical conductivity provided in a form of small elements with size smaller than ¼ of the wavelength of the EM wave in the dielectric host medium of the dielectric layer 3.

In another example, the dielectric layer 3 may be made of an amorphous and gel type dielectric material doped with conductive filling, forming a suspension-type composite material. The percentage of the conductive filling may be varied in order to reproduce the electromagnetic response of a reference object, such as the reflection characteristics at the air-dielectric interface of the human skin tissue.

The thickness of the dielectric layer $T_1$ is preferably comprised between $\lambda_1/10$ and $10 \times \lambda_1$, where $\lambda_1$ is the wavelength of the EM field in the medium of the dielectric layer 3. For instance, the thickness of the dielectric layer $T_1$ may be about 1 mm at 60 GHz. The optimal thickness of the layer 3 depends on the complex permittivity of the medium of said layer 3.

In another aspect, the dielectric layer 3 forms a closed or partly closed shell filled in with a medium, e.g. liquid, gel, foam, or gas. This structure is particularly adapted to simulate the case of a part of a human body, e.g. head-like phantoms. The medium may be chosen to act as the brain and the top surface may present a concave surface in a manner to simulate the form of a head. Alternatively, the medium can be used solely as a mechanical support and/or a host medium for the at least one sensor element 5 placed beneath the dielectric layer 3.

The device further comprises an electromagnetic (EM) field enhancing element 4, positioned on the bottom surface 32 of the dielectric layer 3 and a sensor 5 arranged beneath the electromagnetic field enhancing element 4. The EM field enhancing element 4 is configured to enhance the electromagnetic field transmitted through the dielectric layer 3 and the EM field enhancing element 4. One end 42 of the electromagnetic field enhancing element 4 is directed towards the sensor 5.

In a preferred aspect, the EM field enhancing element 4 is aligned with the sensor 5 along the direction of the electromagnetic wave propagation.

An electromagnetic field source 2 is disposed at a distance H to the device 1. This distance H is preferably larger than the antenna near field zone represented by a circle in FIG. 2. For an electrically small antenna, the reactive near-field zone is approximately defined with respect to the wavelength as $R_{NF}=\lambda_0/2\pi$, where $\lambda_0$ is the wavelength in vacuum. For example, at 60 GHz, the distance $R_{NF}$ is about 0.8 mm.

The source 2 may be a mobile phone or any other portable or wearable wireless device. The one skilled in the art will easily adapts the value of this distance H in order to guarantee an accurate compliance test, representative of a realistic use case situation, such as a mobile phone close to the head of the user. The distance H and the position of the wireless device under test depend on the intended use cases defined by manufacture of the wireless device. For instance, said distance can vary in the range from a few mm (for a smartphone close to a head) to a few tens of cm (for a hand-held device). The source 2 may comprise one or more antennas connected to the body of the source for transmitting and for receiving electromagnetic signals.

As shown in FIG. 2, the electromagnetic field source 2 comprises an antenna 17 which emits an electromagnetic field represented by a circle with a center coinciding with a phase center of the antenna 17. A portion of the electromagnetic wave emitted by the source 2 illuminates the top surface 31 of the device 1. The source 2 may be positioned to direct the EM radiation to preferential locations of the device 1.

The EM source 2 may operate at frequencies in a range from about 6 GHz to about 300 GHz, however the teaching of this disclosure can be scaled to other frequency bands, thanks to the scalability of the Maxwell equations. In particular, it can be downscaled to the microwave frequency range or upscaled to at least the THz frequency range.

As shown in FIG. 2, the EM wave 14 emitted by the source 2 is incident on the top surface 31 of the dielectric layer 3 with an oblique angle of incident θ and the incident wave is partly reflected by the top surface in a direction forming an opposite angle with the normal to the top surface of the dielectric layer 3. The reflected EM wave is designated by the numeric reference 15. A portion of the EM wave that is not reflected at the air/dielectric interface associated with the top surface 31 propagates through the dielectric layer 3, from the top surface 31 to the bottom surface 32, and is partly absorbed in the medium of the dielectric layer 3. The EM wave 16 transmitted through the dielectric layer 3 is then locally enhanced (with the enhancement factor of at least 2 compared to the case of an identical structure without the field enhancing element) achieved by the electromagnetic field enhancing element 4 and directed towards the sensor 5.

Figures 7, 8:
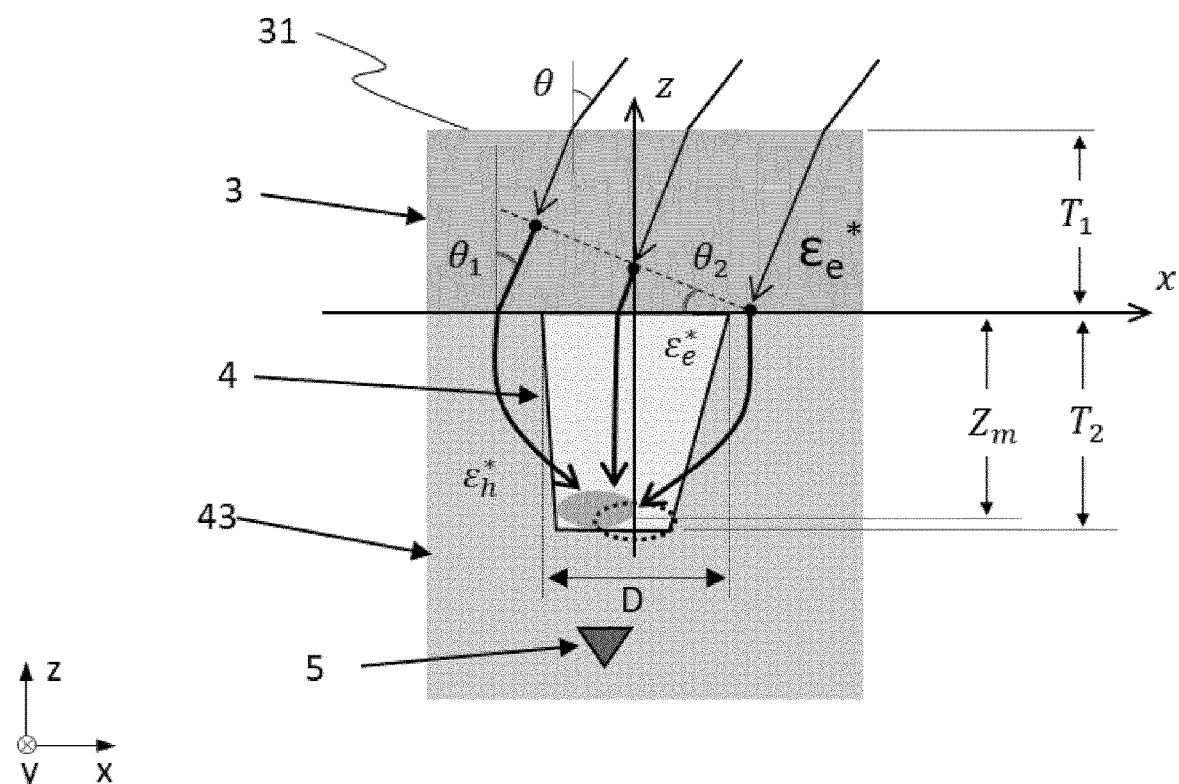
FIG. 7 schematically represents an electromagnetic field enhancing element with a tilted conical shape and a tapered end oriented towards a sensor.
FIG. 8 schematically represents a dosimetry device comprising an electromagnetic sensor.
Figure 9:
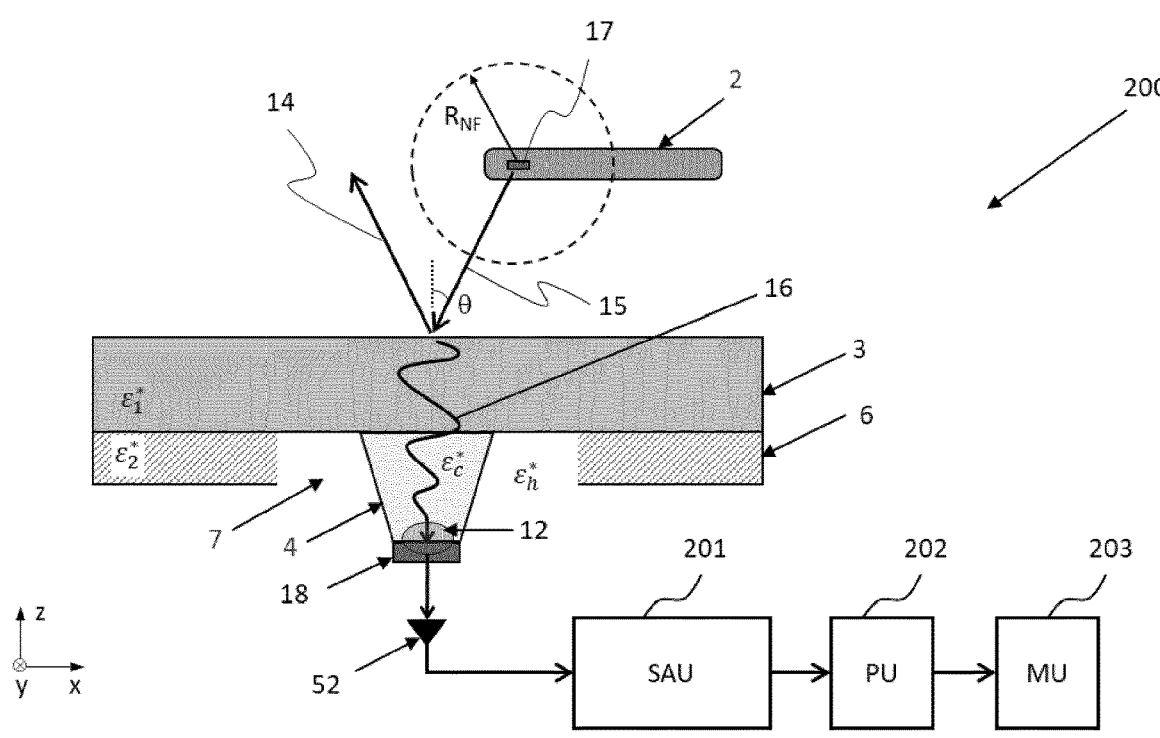
FIG. 9 schematically represents a dosimetry device comprising an electromagnetic sensor and a frequency converter.
Figure 10:
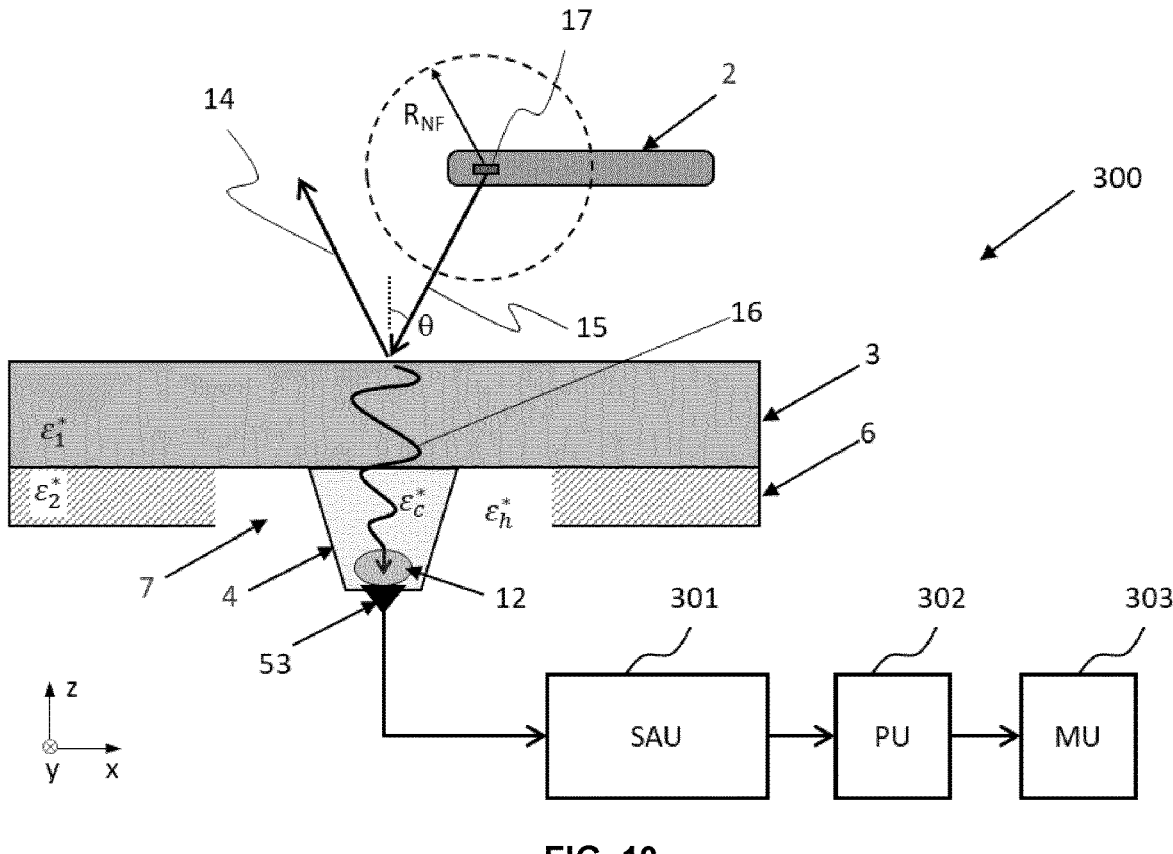
FIG. 10 schematically represents a dosimetry device comprising a thermal sensor.

The sensor 5 is adapted to measure a physical quantity related to the electromagnetic field transmitted through the dielectric layer 3 and the EM field enhancing element 4 and forms an electrical signal. The measured physical quantity may be related to the EM field intensity or the amplitude of the E or H field component of the electromagnetic field transmitted through the different layers. The physical quantity may be also related to the temperature or heat induced by the EM field 16 in the dielectric layer 3 and, in particular, in the EM field enhancing element 4 in a local zone characterized by an enhanced level of the field intensity. In one aspect, the field enhancing element can act simultaneously as the EM field enhancing element and as a heat converting element absorbing the EM field 16 and converting it into the heat re-emitted as infrared radiation. The physical quantity may be related to the electromagnetic field radiated by a frequency converting element exposed to the transmitted electromagnetic field. The sensor 5 may be a radio frequency electromagnetic sensor, a THz electromagnetic sensor, an infrared electromagnetic sensor, an optical electromagnetic sensor, a thermal sensor or any other sensor capable of measuring a physical quantity related to the EM field transmitted through the layer 3 and the element 4. The implementation of the three types of sensors will be detailed below in reference to FIGS. 8-10. As shown in FIGS. 8-10, the electrical signal is then transmitted to a processing unit which is configured to calculate the exposure level produced by the EM source 2 at the surface or inside of the dielectric layer 3, representing a reference object.

The electromagnetic field enhancing element 4 is configured to enhance locally the intensity of the electromagnetic field 16 transmitted through the dielectric layer 3. This element permits to compensate the attenuation of the EM field intensity along the propagation path through the lossy medium of the dielectric layer 3. The EM field enhancing element 4 is made of a dielectric material with a complex permittivity $\varepsilon_e^*$ and has a thickness $T_2$ between one fourth of the wavelength of the EM field emitted by the source 2 in the dielectric medium of the field enhancing element and ten said wavelengths.

The EM field enhancing element 4 may have any shape in the plane (XY), for instance it can be a square, a rectangle, or it can be round. But, as will be explained in more detail below, the shape is preferably chosen to optimize the local enhancement level of the EM field intensity and position of the local maximum of the field intensity pattern, in accordance with the conditions of the radiation from the EM source, e.g. the incident angle, frequency, and polarization of the incident wave.

As shown in FIG. 2, the EM field enhancing element 4 extends from the bottom surface 32 of the dielectric layer 3 towards the sensor 5. The absolute value of the complex permittivity of the material of the field enhancing element 4 is strictly larger than that of the surrounding host medium $\varepsilon_h^*$. The host medium can be represented by gas, liquid, gel, or any solid dielectric material.

In certain aspects, the EM field enhancing element 4 is at least partly embedded in the dielectric layer 3.

Figure 3A:
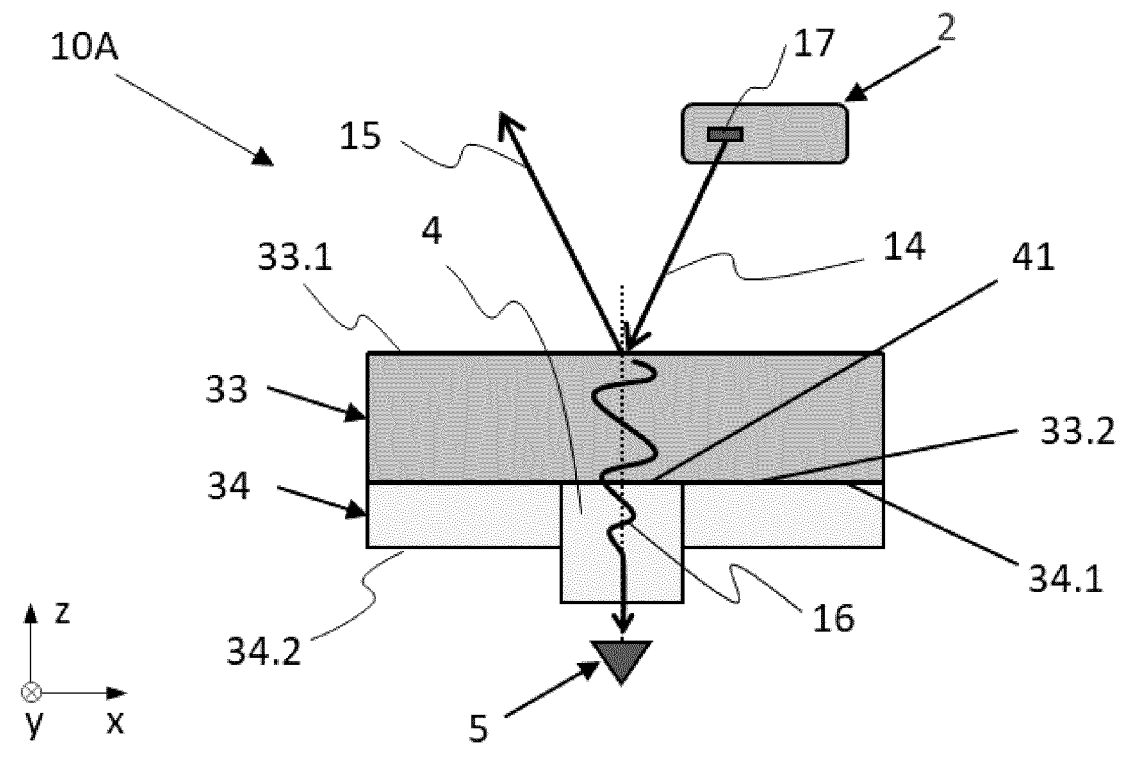
FIG. 3A is a schematic illustration of a cross-sectional view of one aspect of a device for electromagnetic dosimetry comprising two dielectric layers.
Figure 3B:
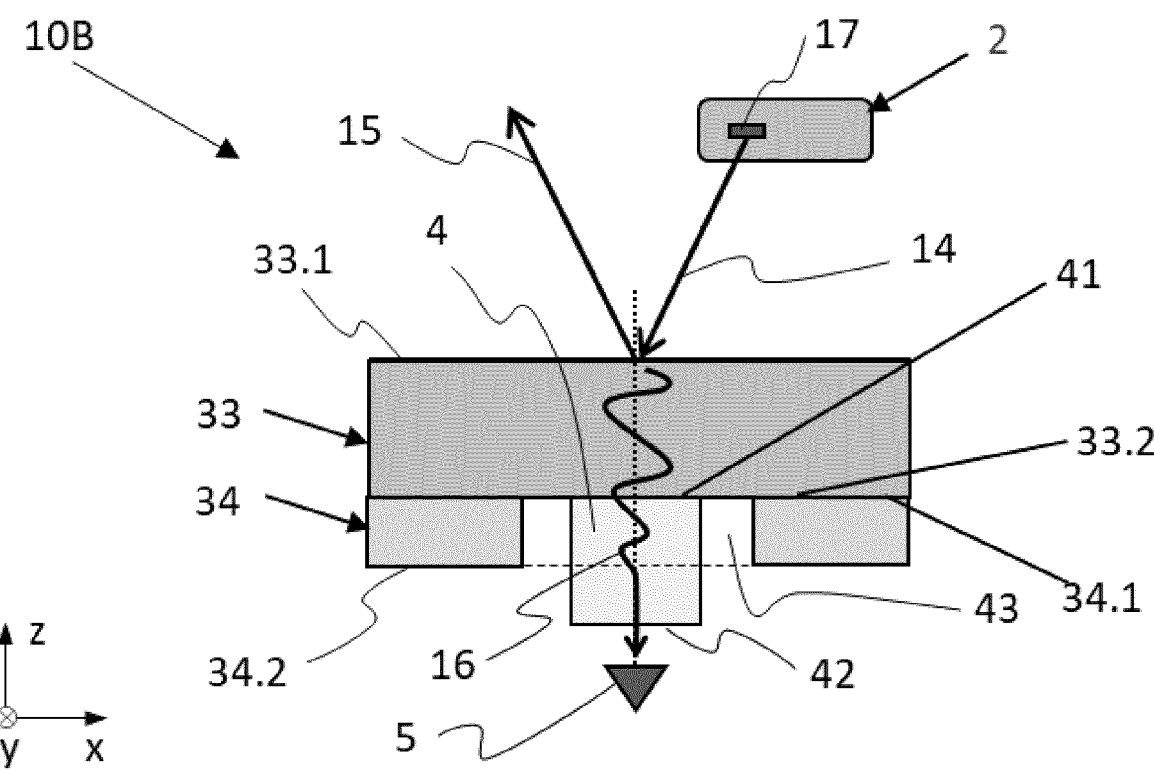
FIG. 3B is a schematic illustration of a cross-sectional view of another aspect of a device for electromagnetic dosimetry comprising two dielectric layers.

The FIGS. 3A and 3B are schematic illustrations of a cross-sectional view of another aspect of an EM dosimetry device, which may be used in place of the device 1 of FIG. 2. The dosimetry devices 10A and 10B are similar to the dosimetry device 1 of FIG. 2.

In FIG. 3A, the device 10A comprises two dielectric layers, a first dielectric layer 33 and a second dielectric layer 34, an EM field enhancing element 4, and a sensor 5 positioned beneath the EM field enhancing element 4. Each dielectric layer 33, 34 defines two main surfaces, an upper surface 33.1, 34.1 and a bottom surface 33.2, 34.2.

The EM field enhancing element 4 is at least partly embedded in the second dielectric layer 34. In one aspect, the upper surface 41 of the EM field enhancing element 4 extends from the bottom surface 33.2 of the first dielectric layer 33 and pass through the second dielectric layer 34. The absolute value of the complex permittivity of the second dielectric layer 34 is strictly smaller than that of the EM field enhancing element 4. In one aspect, the first dielectric layer 33 and the field enhancing element 4 can be beneficially made of the same dielectric material to simplify the manufacturing process. In this aspect, the absolute value of the complex permittivity and thickness of both layers 33 and 34 can be adjusted to achieve the correct reflection coefficient from the upper surface 33.1.

The dielectric structure which simulates the reflection characteristics of a reference object, e.g. human tissues may be composed of more than two dielectric layers.

In FIG. 3B, the device 10B comprises two dielectric layers 33, 34, an EM field enhancing element 4, and a sensor positioned beneath the EM field enhancing element 4. The second dielectric layer 34 further comprises a cavity 43. The EM field enhancing element 4 is placed in the cavity, extending from the bottom surface 33.2 of the first dielectric layer 33. The cavity 43 is filled in with the surrounding host medium characterized by a complex permittivity with absolute value strictly smaller than that of the material of the EM field enhancing element 4.

Figure 4A:
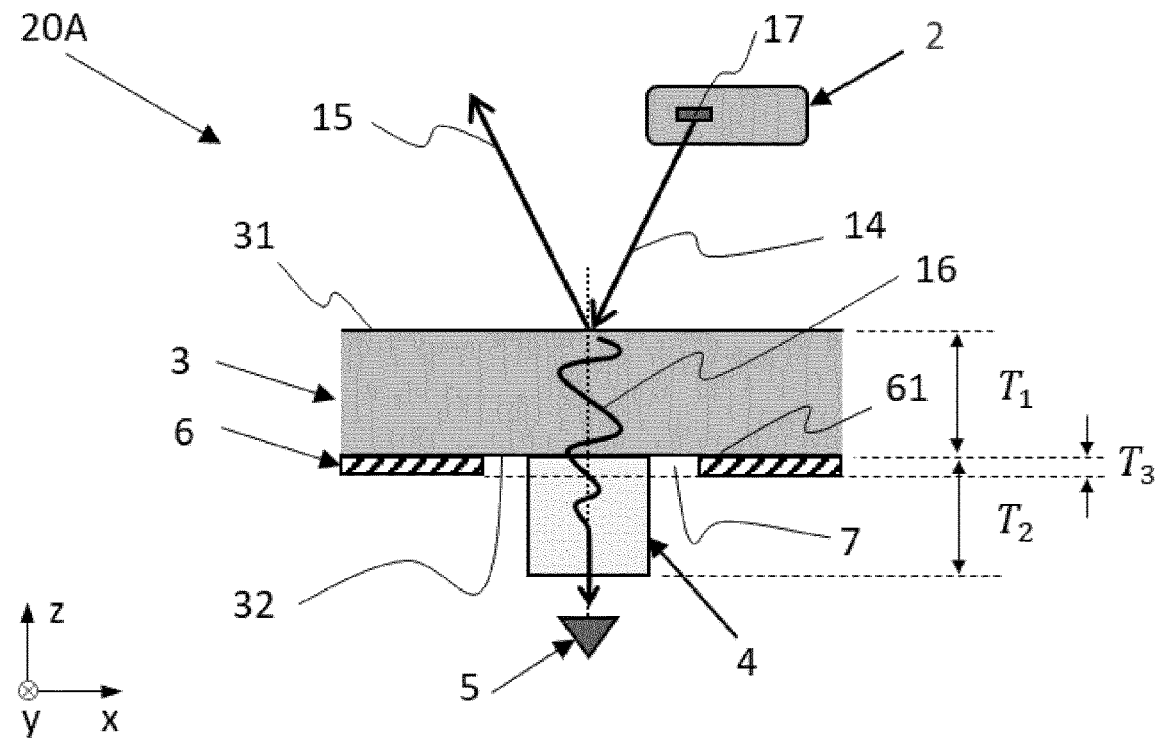
FIG. 4A is a schematic illustration of a cross-sectional view of one aspect of a device for electromagnetic dosimetry comprising one dielectric layer and one conductive layer.
Figure 4B:
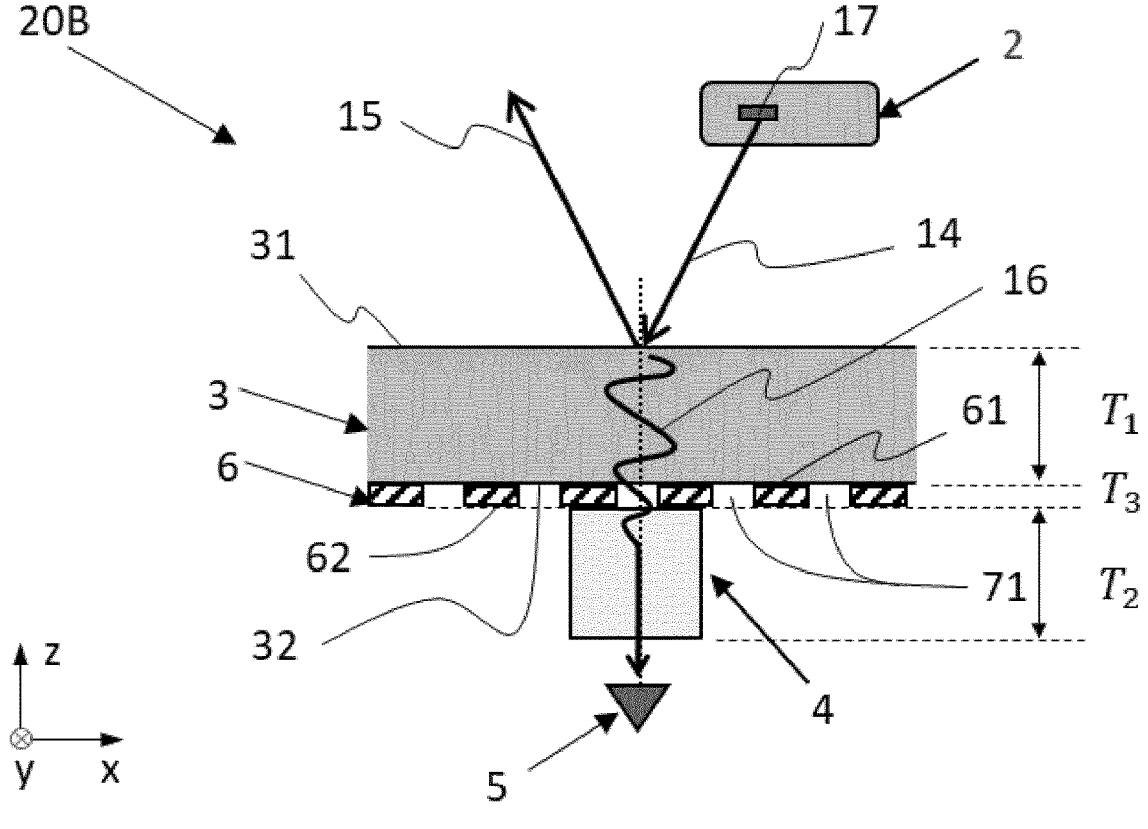
FIG. 4 is a schematic illustration of a cross-sectional view of another aspect of a device for electromagnetic dosimetry comprising one dielectric layer and one conductive layer.
FIG. 4C is a schematic illustration of a cross-sectional view of still another aspect of a device for electromagnetic dosimetry comprising two dielectric layers and one conductive layer.
Figure 4C:
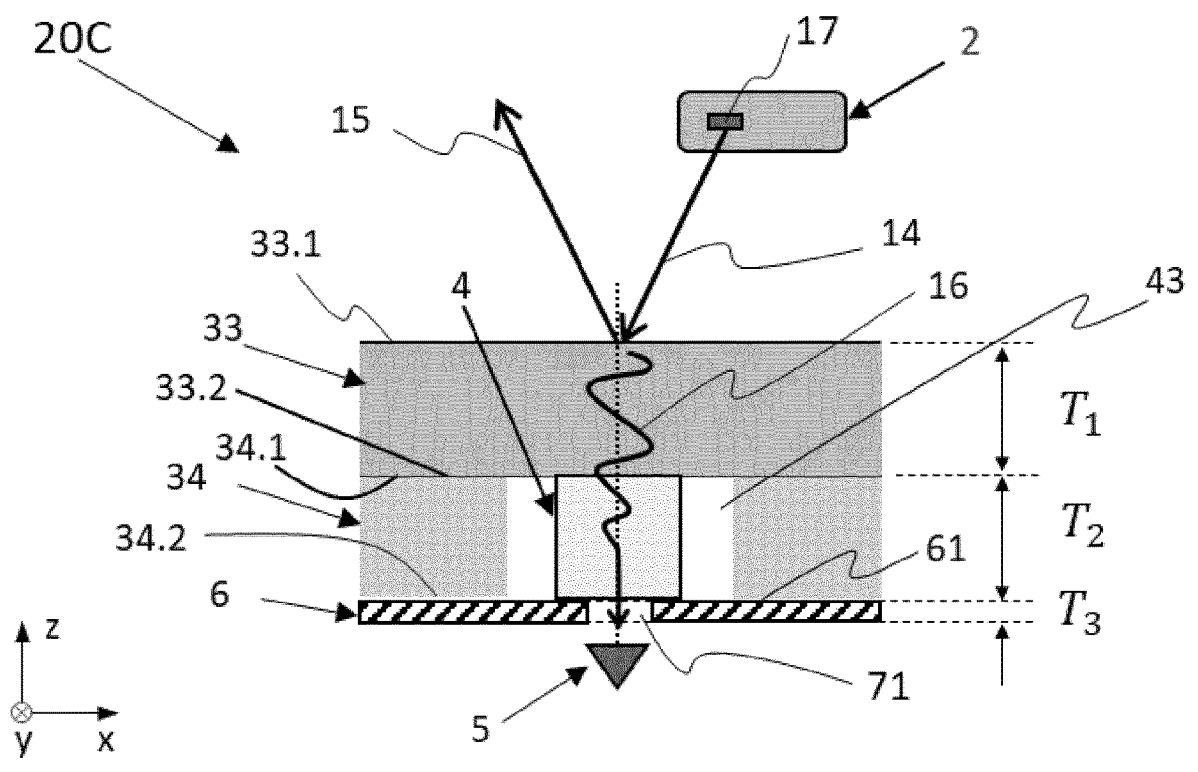

The FIGS. 4A to 4C are schematic illustrations of a cross-sectional view of another aspect of an EM dosimetry device, which may be used in place of the device 1 of FIG. 2 and devices 10A, 10B of FIG. 3.

The structure which simulates some of the EM characteristics of the reference object comprises at least one dielectric layer 3 and at least one electrically conductive layer 6. The dielectric layer 3 has a thickness $T_1$ greater than the thickness $T_3$ of the conductive layer 6.

With reference to FIG. 4A, the dosimetry device 20A comprises one dielectric layer 3, one conductive layer 6, an EM field enhancing element 4 and a sensor 5. The dielectric layer 3 comprises an upper surface 31 and a bottom surface 32. The conductive layer 6 comprises an open cavity 7 extending from the bottom surface 32 of the dielectric layer, through the conductive layer 6. By open cavity 7 it is understood that the cavity has a bottom and an open end opposite its bottom. The bottom of the open cavity 7 is formed by a portion of the bottom surface 32 of the dielectric layer. The open cavity 7 has walls extending from the bottom to its open end, wherein each wall is formed by the thickness of the conductive layer. The field enhancing element 4 is placed in the open cavity 7 and extends from the bottom surface 32 of the dielectric layer 3 towards the sensor 5

The size of the open cavity 7 is larger than the field enhancing element 4. The element 4 is made of the same material as the dielectric layer 3 or of a different dielectric material. Preferably, the EM field enhancing element 4 is positioned in the open cavity 7 and centered in the open cavity.

With reference to FIG. 4B, the device 20B comprises one dielectric layer 3 and one conductive layer 6, an EM field enhancing element 4 and a sensor. The dielectric layer 3 comprises an upper surface 31 and a bottom surface 32. The upper surface 61 of the conductive layer 6 comprises an upper surface 61 and a bottom surface 62. The conductive layer 6 is in touch with the bottom surface 32 of the dielectric layer 3. The conductive layer 6 comprises a plurality of through holes 71 extending from the bottom surface 32 of the dielectric layer, through the conductive layer 6. In another aspect, the conductive layer may have only one through hole. Each through hole 71 has a bottom and an open end opposite its bottom. The bottom of the through hole 71 is formed by a portion of the bottom surface 32 of the dielectric layer. The EM field enhancing element 4 is positioned on the bottom surface 62 of the conductive layer 6. The size of the through holes 71 is smaller than that of the EM field enhancing element 4 which covers at least one through hole 71. In a preferred aspect, the EM field enhancing element 4 is aligned with at least one through hole.

These through holes 71 form a transparent zone for the transmission of the EM field. The EM field enhancing element 4 is positioned on the through hole and provides a phase correcting effect for the wave front of the EM field transmitted through the dielectric layer 3 and the at least one through hole 71.

With reference to FIG. 4C, the device 20C comprises a first dielectric layer 33, a second dielectric layer 34, one conductive layer 6, an EM field enhancing element 4, and a sensor 5 positioned beneath the EM field enhancing element 4. Each dielectric layer 33, 34 defines two main surfaces, an upper surface 33.1, 34.1 and a bottom surface 33.2, 34.2. The conductive layer 6 covers the bottom surface 34.2 of the second dielectric layer. In addition, the conductive layer comprises a through hole 71.

The EM field enhancing element 4 is positioned in the open cavity 43 and aligned with the through hole 71 and can also provide enhanced transmission of the EM field 16 through the hole 71 that can otherwise, in absence of the field enhancing element 4, block propagation of the EM field 16 by reflecting or absorbing. The through hole 71 can have subwavelength dimensions. In other words, the size of the through hole 71 can be smaller than the wavelength in the host medium.

The second dielectric layer 34 further comprises a cavity 43 extending from the bottom surface 33.2 of the first dielectric layer 33, through the second dielectric layer 34. By cavity 43 it is understood that the cavity has a bottom and an open end opposite its bottom. The bottom of the cavity 43 is formed by a portion of the bottom surface 33.2 of the first dielectric layer and the open end is formed by the through hole 71 of the conductive layer 6. The EM field enhancing element 4 is placed in the cavity 43, extending from the bottom surface 33.2 of the first dielectric layer 33 to the upper surface of the conductive layer 6. In a preferred aspect, the EM field enhancing element 4 is centered in the cavity 43 and is aligned with the through hole 71 and the sensor 5. The cavity 43 is filled in with the surrounding host medium characterized by a complex permittivity with absolute value strictly smaller than that of the material of the EM field enhancing element 4.

The through hole 71 is smaller or equal than the bottom end of the EM field enhancing element 4. Thus, the element 4 is fully embedded in the second dielectric layer 34. The EM field enhancing element 4 enables to achieve a local field enhancement and can provide enhanced transmission of the EM field through the through hole 71.

The shape of the trough holes of FIGS. 4B and 4C is indifferent, i.e. it can be a square, a rectangle, it can be circular etc. but, as will be explained in more details below, is preferably chosen to make the alignment easier with the EM field enhancing element. Additionally, the shape of the through holes are advantageously configured to optimize the EM transmission. The minimum size of the through hole 71 is defined with respect to its contour line whose length shall be at least equal to a quarter of the wavelength of the EM field in the medium of a dielectric layer 3 in touch with the bottom end of the through hole 71 of FIG. 4B, or in the medium of the field enhancing element 4 in touch with the bottom end of the through hole 71 of FIG. 4C, or in a host medium filling the through hole 71. In one aspect, the through holes 71 can merge forming a transparent mesh surrounding isolated islands made of a conductive material representing the layer 6.

Preferably, the surface of the transparent zone formed by the at least one through hole is less than 80% of the surface of the reflecting zone formed by the conductive layer.

Figure 5:
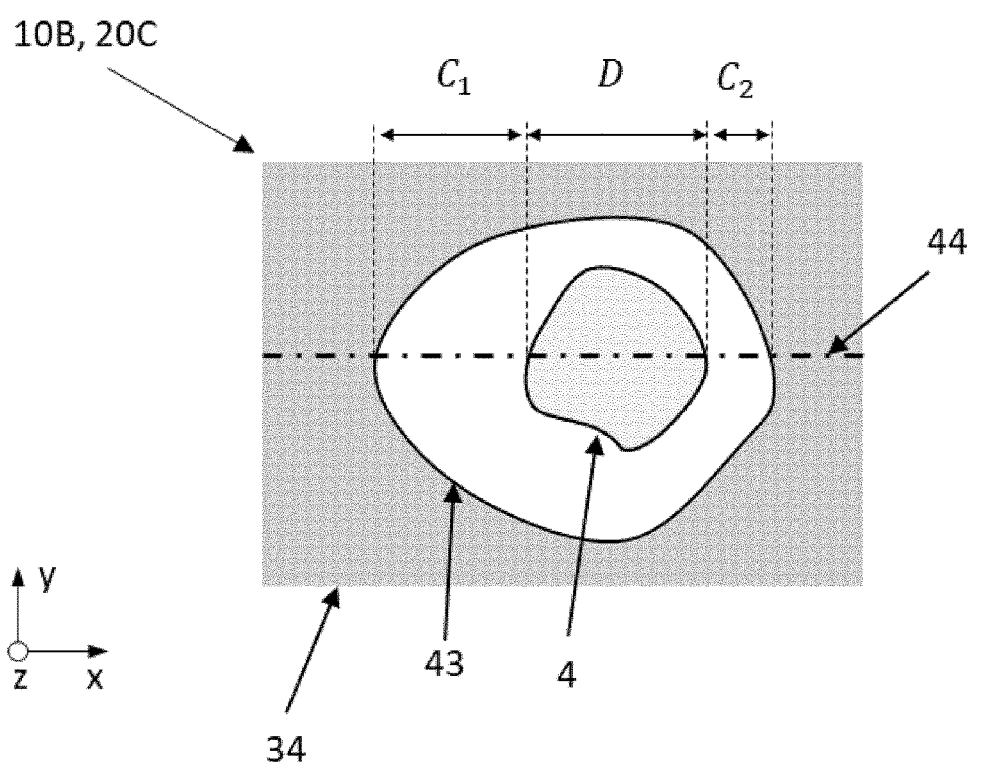
FIG. 5 schematically represents a cross-sectional view of a generic topology of the electromagnetic field enhancing element for the device for electromagnetic dosimetry of FIG. 3B and FIG. 4C.

The FIG. 5 illustrates a cross-sectional view of the device 10B of FIG. 3B or device 20C of FIG. 4C in a X-Y plane, showing a generic topology of the field enhancing element 4 placed in the cavity 43 present in the second dielectric layer 34. The minimum size of the cavity 43, embedding the field enhancing element 4, is defined with respect to a minimum size of the open cavity in at least one vertical cut plane 44 crossing the field enhancing element 4 and the cavity 43. The minimum size is at least equal to a half of the wavelength in the host medium ($\lambda_h$) filling in the cavity, i.e. max ($C_1$, $C_2$)$\geq\lambda_h$/2, where $C_1$ and $C_2$ denote the size of the open cavity 43 in the cut plane 44. The maximum size of the open cavity in the cut plane is not defined because the host medium can at least extend beneath the entire dielectric layer 3 (as in FIG. 2).

With reference to FIG. 5, the minimum size of the element 4 is defined with respect to its dimension in the same cut plane 44. The minimum size $D_{min}$ is at least equal to a half of the wavelength in the medium of the field enhancing element 4 ($\lambda_e$), i.e. $D_{min}\geq\lambda_e$/2, whereas the maximum size $D_{max}$ of the field enhancing element 4 in the same cut plane 44 is defined as ten times wavelengths in the medium of the element 4, i.e. $D_{max}\geq10\times\lambda_e$.

The shapes and the dimensions of the EM field enhancing element 4 are advantageously configured to optimize the enhancement of the EM field transmitted through the at least one dielectric layer 3 (FIG. 2, 3) and through the through hole 71 (FIG. 4). The shape of the EM field enhancing element 4 and the shape of the open cavity 43 in the X-Y plane may be indifferent, e.g. they can be a square, a rectangle, or circular. There are different combinations between the shape of the EM field enhancing element 4 and the shape of the cavity leading to polarization insensitive and sensitive behavior in case of a symmetrical and non-symmetrical shape, respectively. The relative position of the field enhancing element 4 inside the cavity 7 can also vary, to adapt for the illumination conditions with the centered advantageously used for the normal incidence.

Figure 6A:
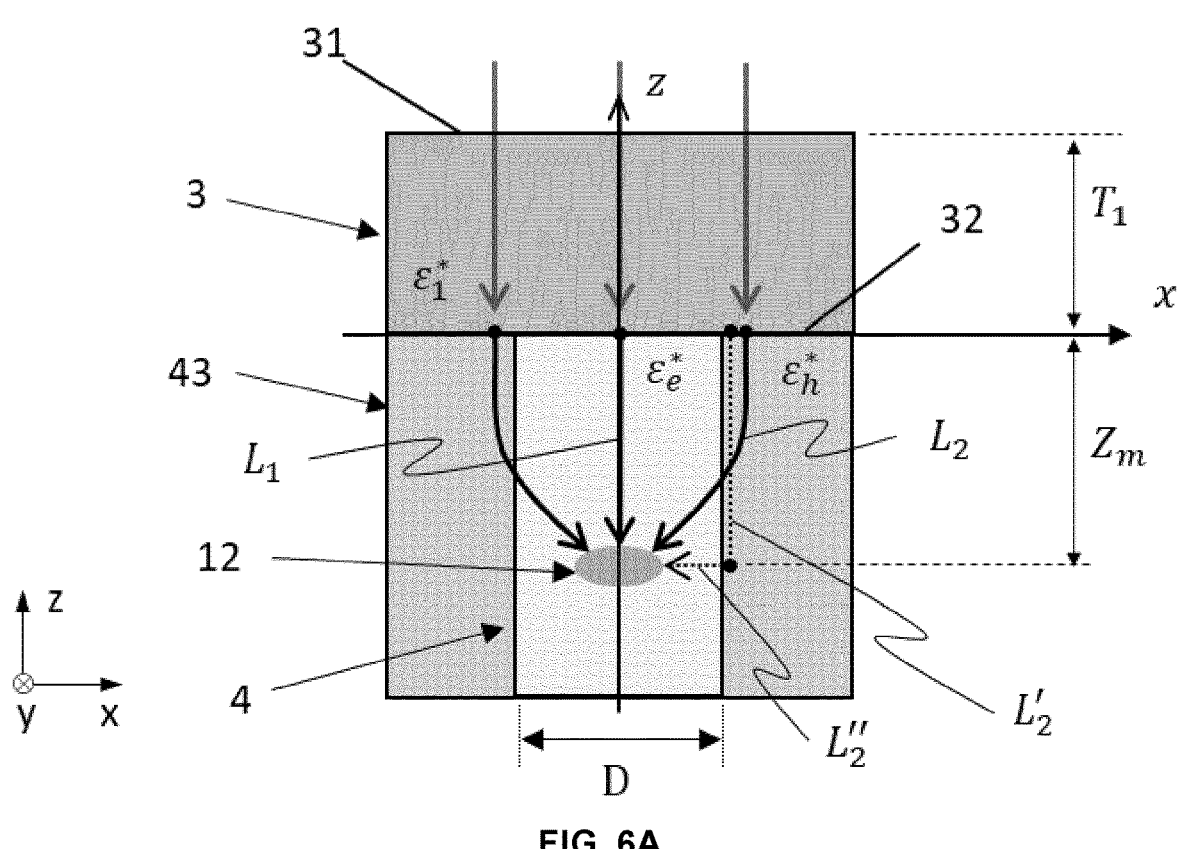
FIG. 6A schematically represents the formation of a hot zone corresponding to an enhanced electromagnetic field intensity, in case of a normal illumination.
Figure 6B:
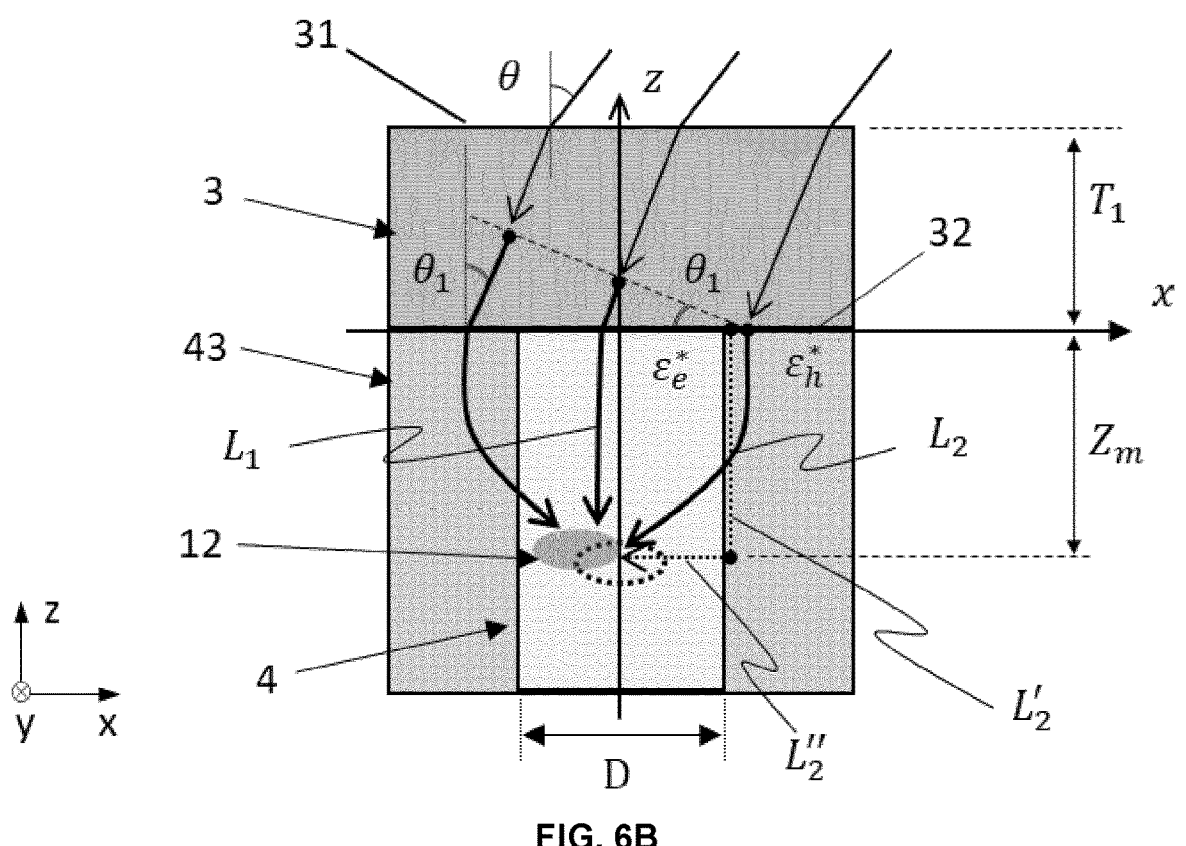
FIG. 6B schematically represents the formation of a hot zone corresponding to an enhanced electromagnetic field intensity, in case of an inclined illumination.

With reference to FIGS. 6A and 6B, the function of the EM field enhancing element 4 is detailed below.

When the upper surface 31 of the device of the FIGS. 6A and 6B are illuminated by an EM field emitted by the source 2, a portion of the EM wave is reflected from the upper surface 31 of the dielectric layer 3, a portion of the EM wave is absorbed by the dielectric layer 3 and the EM field enhancing element 4, and a portion of the EM wave propagates toward the sensor 5.

As shown in FIG. 6A and in case of an illumination with a normal incidence with respect to the bottom surface 32 of the dielectric layer 3, after crossing the plane at Z=0, a portion of the wave front is crossing the field enhancing element 4 made of a dielectric material characterized by a complex permittivity $\varepsilon_e{}^*$ and a portion of the wave front is passing through the host medium characterized by a complex permittivity $\varepsilon_h{}^*$ with absolute value strictly smaller than that of the field enhancing element ($|\varepsilon_e{}^*|>|\varepsilon_h{}^*|$). The wave fronts have different phase velocities related to the different permittivity of the corresponding media. The inter-ference of the two waves along the axis of the field enhanc-ing element 4 leads to creation of a hot zone 12, correspond-ing to an enhanced field intensity level, due to the constructive interference between the wave propagating along the path denoted $L_1$ inside the EM field enhancing element 4 and the other wave propagating partly inside the host medium 43 and partly inside the EM field enhancing element 4 along a longer path $L_2=L_2'+L_2''$. The equality of the optical length of these two paths in the hot zone 12 is provided thanks to the lower permittivity of the host medium resulting in a higher phase velocity.

Thanks to the presence of the EM field enhancing ele-ment, it is possible to enhance the EM field at a determined position $Z_m\approx D/2\times(1-n_h/n_e)^{-1}$, where D is the cross-sectional size of the EM field enhancing element in a vertical cut plane 44 at z=0, where $n_e$ and $n_h$ denote the absolute value of the complex refractive index of the dielectric medium of the element 4 ($n_e=(|(\varepsilon_e{}^*)^{1/2}|)$ and that of the host medium ($n_h=(|(\varepsilon_h{}^*)^{1/2}|)$, respectively. The position of the hot zone 12 is defined by the ratio of the refractive indexes $n_h/n_e$ and does not depend on the frequency of the EM field. This allows advantageously to provide a non-resonant enhancing element capable of enhancing by at least a factor of 2 the EM field intensity in a determined position $Z_m$ in a wide fre-quency range, e.g. around 24 GHz or around 60 GHz particularly adapted for 5G and future 6G wireless commu-nication device. The thickness $T_1$ is equal or larger than $Z_m$ which represent the distance between the bottom surface 32 et the spot zone 12.

According to another advantage, the enhancement ele-ment 4 can be easily scaled to another operating frequency range of the source 2, for instance from 300 MHz to 30 THz.

With reference to FIG. 6B and in case of an illumination with an oblique angle $\theta_1$ on the bottom surface 32 of the dielectric layer 3, the initial difference in the phase between the different parts of the wave front when arriving at z=0 results in a shift of the hot zone 12 in the direction deter-mined by the propagation direction of the incident EM wave. The shift is proportional to the initial phase difference and can be calculated as a function of the incident angle $\theta_1$. The functionality of the field enhancing element is preserved at least up to $\theta_1\leq30°$.

In a preferred aspect, the EM field enhancing element 4 is covered by the dielectric layer 3 with minimum thickness $T_1$ equal of larger than a one tenth of the wavelength in the dielectric material of said layer 3.

In another preferred aspect, the height of the EM field enhancing element 4 is defined in a manner to form a hot zone 12, corresponding to a zone with an enhanced field intensity, close to the end of the EM field enhancing element 4.

Due to the enhanced level of the useful signal provided in the hot spot zone, it is possible to provide an improved signal-to-noise ratio (SNR) for the EM sensor 5 placed beneath the end of the EM field enhancing element 4 with the height equal or slightly larger than the distance from the bottom surface 32 of the dielectric layer 3 to the position of the hot zone 12 inside the field enhancing element 4 ($T_2\geq Z_m$).

According to another advantage achieved due to the enhanced level of the EM field intensity in the hot zone 12, an effective EM field to heat conversation can be provided inside the field enhancing element 4.

In another aspect illustrated in FIG. 7, a cylindrical shape of EM field enhancing element 4 with an arbitrary cross-section in the X-Y-plane can be transformed into a tilted conical shape with the tapered end of the field enhancing element 4 oriented towards the sensor 5. The size of the tapered tip can be advantageously selected with respect to the hot zone size and position for the two extreme illumination angles defined according to an intended use case scenario, namely the minimum and the maximum values of angle $\theta_1 = \sin^{-1}(\sin(\theta)/n_1)$ where $(\theta_{min}, \theta_{max})$ defines the range of possible incident angles of the EM wave on the upper surface of the dielectric layer 3 characterized by the refractive index $n_1 = (\varepsilon_1{}^*)^{1/2}$.

The FIGS. 8 to 10 illustrate a system 100, 200, 300 for measuring a physical quantity related to an electromagnetic field emitted by an electromagnetic source 2. The system comprises a dosimetry device as described above 1, 10, 20, 30, 40, 50, 60, a signal analyzing unit 101, 201, 301 configured to analyze the signal transmitted from the at least one sensor 51, 52, 53, a processing unit 102, 202, 302 configured to calculate a dosimetric quantity and a memory unit 103, 203, 303.

The proposed dosimetry device allows to implement several types of sensors.

The FIG. 8 shows an aspect of a dosimetry device 100 using an electromagnetic sensor 51 to measure the enhanced transmitted EM field. This sensor may be represented for example by a waveguide probe or a microstrip patch antenna operating in the frequency range of the EM source 2. The radio-frequency signal captured by the sensor 51 is guided to a signal analyzing unit 101 (SAU), connected to a processing unit 102 (PU) and a memory unit 103 (MU) that are used to post-process and to store the measured data.

The FIG. 9 shows an aspect of a dosimetry device 200 using an EM sensor which operates in a frequency range different from that of the EM source 2. In other words, the electromagnetic sensor 52 is adapted to measure the EM field emitted at a frequency $f_2$ different from the operational frequency of the source. The range may be infra-red or optical range. The one sensor can be an optical electromagnetic sensor 52. The optical signal captured by the optical EM sensor 52 is processed by a signal analyzing unit 201, connected to a processing unit 202 and a memory unit 203 that are used to post-process and to store the measure data.

In this aspect, the conversion of the EM field defined by the frequency $f_1$ radiated by the EM source 2 into the EM field defined by the frequency $f_2$ can occur due to a temperature rise induced in the field enhancing element 4, due to the EM wave absorption, which is proportional to the intensity of the EM field in the hot zone 12. This allows to quantitatively characterize the intensity of the EM field radiated by the EM source 2, incident on and transmitted through the dielectric layer 3 and the field enhancing element 4, by post processing the data related to the heat dynamics or to any other change of a physical parameter related to heating measured by the sensor 52.

The optical EM sensor 52 may be an infrared (IR) camera placed below the EM field enhancing element 4 with a field of view covering the plurality of the EM enhancing elements 4 acting as frequency converters, absorbing the EM power of the EM wave 16 and converting it into the heat and generating the IR radiation captured by the sensor 52.

In another aspect, the dosimetry device 200 further comprises a frequency converter 18 configured to convert the incident EM field with frequency $f_1$ into the EM field with frequency $f_2$ emitted by the frequency converting element 18. This frequency converter 18 permits to effectively convert the EM field with frequency $f_1$ into the EM field with frequency $f_2$ to improve the SNR of the optical EM sensor 52 operating at the frequency $f_2$. In a preferred aspect, the EM field enhancing element 4 may act as such a frequency converter from RF to IR range. In another aspect, the frequency converter can be represented by a thin film of a lossy dielectric material covering the end of the field enhancing element 4, characterized by high EM loss at the frequency $f_1$ and high radiation efficiency at the frequency $f_2$. For instance, this can be carbon, graphite, graphene, or a paint doped with conductive micro-particles.

The frequency converter is placed close to the hot zone 12 in order to guarantee the conversion efficiency and improved level of the useful signal at the frequency $f_2$. In a preferred aspect, the frequency converter is positioned in direct contact with or incorporated into the field enhancing element 4.

The frequency converter 18 can also be configured to amplify the intensity of the re-emitted EM field thanks to an external power supply. Such a frequency converter may be represented by a liquid crystal based element or a light emitting diode (LED) capable of generating visible light with frequency $f_2$ when exposed to EM field with frequency $f_1$ acting as a trigger for a transistor-type switch used for tuning the intensity or frequency of the emitted light.

The FIG. 10 shows yet another aspect of the dosimetry device 300 using a thermal sensor 53. The thermal sensor 53 may be a thermocouple or an optical fiber thermometer. The optical fiber thermometer comprises a thermo-sensitive element, for example a GaAs semiconductor crystal, mounted on the tip of an optical fiber. As shown in FIG. 10, the thermo-sensitive element is in direct contact with the EM field enhancing element 4. The signal captured by the thermal sensor 53 is guided to a signal analyzing unit 301, connected to a processing unit 302 and a memory unit 303 that are used to post-process and to store the measure data.

The FIGS. 2 to 10 shows an aspect of the device comprising only one EM field enhancing element 4. The device may have only one sensor 5 aligned with one through hole 7, 71 and the EM field enhancing element 4. In these configurations, the device allows the measurement of the EM field quantities in a single point or at an elementary surface area of the dielectric bottom surface 32. The measured dosimetric quantity can further be used to calculate, via post-processing, any other EM field quantity per an averaging surface area at the upper surface 31 or per an averaging volume inside the dielectric layer 3 (e.g. incident, transmitted or absorbed power density) by taking into account the EM field attenuation along its propagation path in the dielectric layer 3. In one aspect, the size of the elementary surface area associated with the at least one field enhancing element 4 can be beneficially selected to be equal to or multiple of the averaging surface area or volume in the definition of the dosimetric quantity measured by the device.

In another aspect, the proposed device may comprise a plurality of EM field enhancing element 4 attached to or embedded in the dielectric layer 3, each EM field enhancing element 4 configured to cover a complementary portion of the EM field measurement specifications, e.g. a portion of the range of the operational frequencies of the EM source 2, a sub-range of the incident angles, and/or at least one polarization. In this configuration, the proposed dosimetry device can be considered to include a plurality of unit cells. The device may have a plurality of identical cells. Each unit cell comprises an elementary measurement unit of the device capable of measuring the EM field quantities under certain illumination conditions, e.g incident angle, frequency, polarization. Such a dosimetry device may comprise only one sensor 5, capable of simultaneously measuring a physical quantity for each unit cell (e.g. infrared or optical image sensor with a wide field of view), or a plurality of sensors 5, each senor being aligned with at least one of the plurality of the EM field enhancing elements 4.

Figure 11:
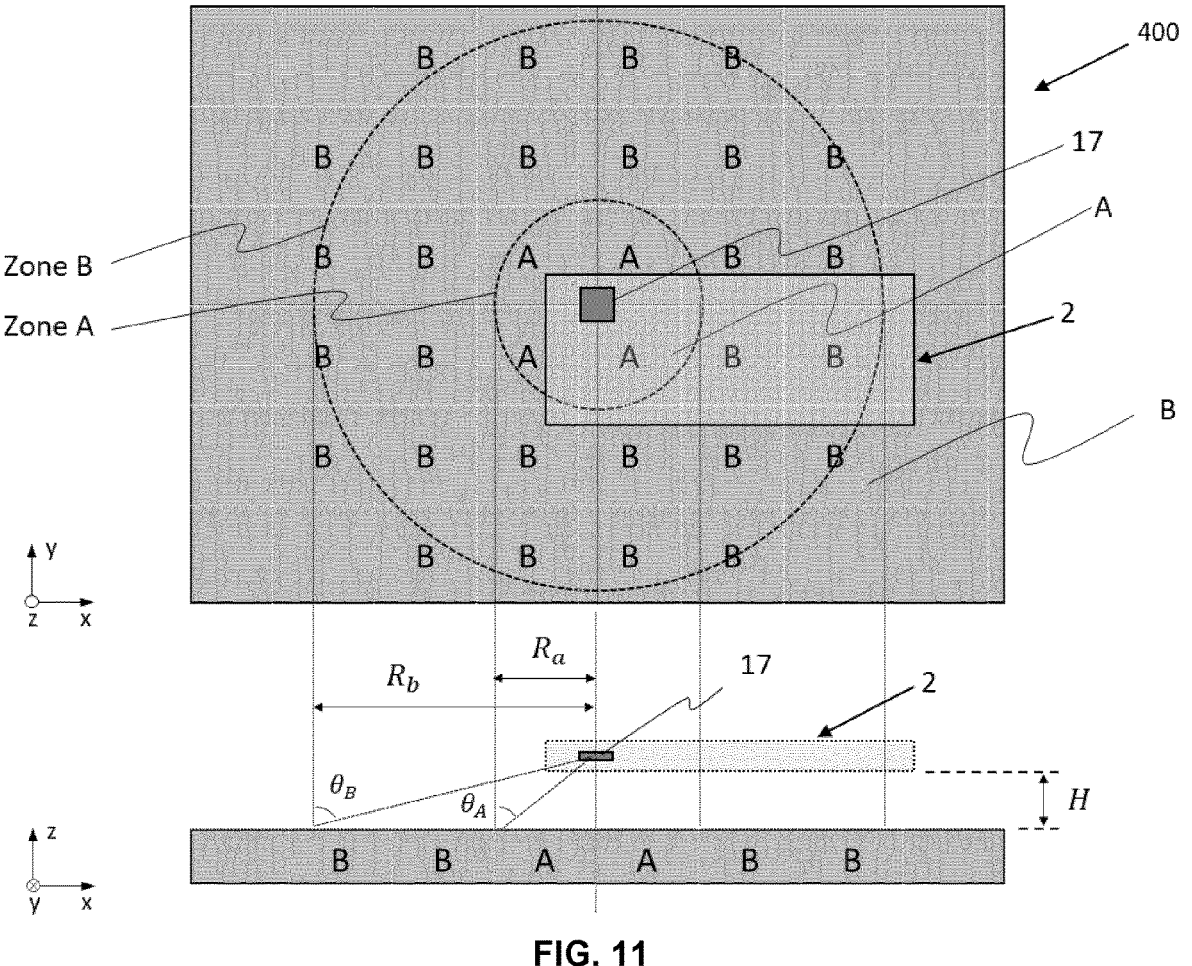
FIG. 11 schematically represents a top view and a side view of a dosimetry device comprising a plurality of two types of unit cells A and B, each unite cell being adapted to cover one zone of a surface area illuminated by an electromagnetic field emitted by an electromagnetic source with determined specific illumination conditions: polarization of the EM field, range of incident angles and frequency ranges.

The FIG. 11 shows an aspect of the device 400 comprising two types of unit cells A and B. The unit cell A includes EM field enhancing elements configured to measure the EM field quantities for the angular range between 0 and $\theta_A$. The unit cell B includes EM field enhancing elements configured to measure the EM field quantities for the angular range between $\theta_A$ and $\theta_B$.

In the aspect of FIG. 11, the plurality of unit cells A and B are arranged within two concentric zones A and B aligned with the central point (X=0 and Y=0) of the device. The central point corresponds to the required test position of the antenna 17 of the EM source 2 with respect to the device 400. In other words, the antenna phase center is aligned with the test position along a vertical axis Z. The radius of the two zones A and B is determined as a function of the relative position of the EM source 2 and of the operational angular range of the EM field enhancing element 4 of type A and of type B characterized by different form as explained in FIGS. 5-7.

What is claimed is:

1. A device for measuring a physical quantity related to an electromagnetic (EM) field emitted by an electromagnetic source, the device configured to simulate the EM characteristics of a reference object made of a lossy medium, the device comprising:

at least one dielectric layer comprising an upper surface face to the electromagnetic source and a bottom surface, said dielectric layer being at least partly transparent to the EM field emitted by the electromagnetic source;

at least one electromagnetic field enhancing element arranged relative to the at least one dielectric layer and configured to enhance the intensity of the electromagnetic field transmitted through the at least one dielectric layer in a pre-determined zone; and at least one sensor arranged beneath the at least one electromagnetic field enhancing element and configured to measure said physical quantity related to the electromagnetic field transmitted through the at least one dielectric layer and the at least one electromagnetic field enhancing element.

2. The device of claim 1, wherein the at least one electromagnetic field enhancing element extends from the bottom surface of the at least one dielectric layer towards the at least one sensor.

3. The device of claim 1, wherein the at least one electromagnetic field enhancing element is at least partly embedded in the at least one dielectric layer, said at least one dielectric layer having a complex permittivity with absolute value smaller than that of the material of the EM field enhancing element.

4. The device of claim 3, comprising at least two dielectric layers, the dielectric layer having a bottom surface face to the sensor comprising a cavity filled with a host medium, the at least one electromagnetic field enhancing element being placed in the cavity, the host medium having a complex permittivity with absolute value smaller than that of the material of the EM field enhancing element.

5. The device of claim 1, further comprising at least one electrically conductive layer positioned on the bottom surface of the at least one dielectric layer.

6. The device of claim 5, wherein the at least one electrically conductive layer comprises one open cavity, the electromagnetic field enhancing element being placed in the open cavity.

7. The device of claim 5, wherein the at least one conductive layer comprising at least one through hole and the size of the at least one through hole being smaller than that of the EM field enhancing element, the EM field enhancing element is positioned on the bottom surface of the conductive layer to cover at least one through hole.

8. The device of claim 4, wherein at least one conductive layer comprising at least one through hole and the size of the at least one through hole being smaller than that of the EM field enhancing element, the EM field enhancing element placed in the cavity is aligned with the at least one through hole.

9. The device of claim 1, wherein a dimension of the electromagnetic field enhancing element is configured to generate a hot zone, corresponding to an enhancement of the electromagnetic field intensity, in a determined position $(Z_m)$ close to one end of the electromagnetic field enhancing element.

10. The device of claim 1, wherein a minimum size of the electromagnetic field enhancing element in a cut plane (X-Y) is equal or greater than a half of a wavelength in the medium of the EM field enhancing element and a maximum size of the electromagnetic field enhancing element in a cut plane (X-Y) is equal or smaller than ten times the wavelength in the medium of the EM field enhancing element.

11. The device of claim 1, wherein the at least one sensor is a thermal sensor positioned in direct contact with the at least one electromagnetic field enhancing element or embedded in the at least one electromagnetic field enhancing element.

12. The device of claim 1, wherein the at least one sensor is an electromagnetic sensor operating at the frequency of the source.

13. The device of claim 1, wherein the at least one sensor is an electromagnetic sensor operating at a frequency different from that of the electromagnetic source.

14. The device of claim 13, further comprising a frequency converter in contact with or embedded in one end of the at least one electromagnetic field enhancing element.

15. The device of claim 1, comprising a plurality of electromagnetic field enhancing element, each element being configured to cover a complementary portion of the electromagnetic field transmitted through one zone of the surface area of the reference object illuminated by an electromagnetic field emitted by the electromagnetic source, said complementary portion of the electromagnetic field being defined by the illumination conditions.

16. A system for measuring a dosimetry quantity related to an electromagnetic (EM) field emitted by an electromagnetic source comprising the device of claim 1, a signal analyzing unit configured to analyze the signal transmitted from the at least one sensor, a processing unit configured to calculate the electromagnetic dosimetry quantities and a memory unit.

* * * * *